United States Patent
Asai et al.

(10) Patent No.: US 11,563,415 B2
(45) Date of Patent: Jan. 24, 2023

(54) COMMON MODE FILTER

(71) Applicant: TDK Corporation, Tokyo (JP)

(72) Inventors: Yugo Asai, Tokyo (JP); Tsutomu Kobayashi, Tokyo (JP); Daisuke Urabe, Tokyo (JP); Hiroshi Suzuki, Tokyo (JP); Emi Ito, Yamagata (JP); Toshio Tomonari, Tokyo (JP)

(73) Assignee: TDK CORPORATION, Tokyo (JP)

( * ) Notice: Subject to any disclaimer, the term of this patent is extended or adjusted under 35 U.S.C. 154(b) by 1061 days.

(21) Appl. No.: 16/236,562

(22) Filed: Dec. 30, 2018

(65) Prior Publication Data

US 2019/0228901 A1 Jul. 25, 2019

(30) Foreign Application Priority Data

Jan. 5, 2018 (JP) .............................. JP2018-000751
Dec. 14, 2018 (JP) .............................. JP2018-234484

(51) Int. Cl.
*H03H 7/42* (2006.01)
*H01F 27/28* (2006.01)
*H01F 17/00* (2006.01)
*H03H 7/09* (2006.01)
*H03H 1/00* (2006.01)
*H01F 27/06* (2006.01)
*H01F 17/04* (2006.01)
*H01F 27/00* (2006.01)

(52) U.S. Cl.
CPC ............ *H03H 7/427* (2013.01); *H01F 17/04* (2013.01); *H01F 17/045* (2013.01); *H01F 27/006* (2013.01); *H01F 27/06* (2013.01); *H01F 27/2823* (2013.01); *H03H 1/00* (2013.01); *H03H 7/09* (2013.01); *H01F 2017/0093* (2013.01); *H03H 2001/0035* (2013.01); *H03H 2001/0092* (2013.01)

(58) Field of Classification Search
CPC ............ H03H 7/427; H01F 2017/0093; H01F 27/2895; H01F 27/28; H01F 27/006; H01F 27/2823
USPC ............................................ 333/12, 181, 185
See application file for complete search history.

(56) References Cited

U.S. PATENT DOCUMENTS

2014/0167903 A1* 6/2014 Tomonari ............ H01F 27/2823
336/220
2015/0206646 A1 7/2015 Dinh et al.

FOREIGN PATENT DOCUMENTS

CN 206532684 U 9/2017
JP 2008034777 A 2/2008
JP 2014-199904 10/2014

* cited by examiner

*Primary Examiner* — Rakesh B Patel
(74) *Attorney, Agent, or Firm* — Young Law Firm, P.C.

(57) ABSTRACT

Disclosed herein is a common mode filter that includes a winding core part and first and second wires wound in a same direction around the winding core part. The first and second wires constitute a first winding block on one endmost side in an axial direction of the winding core part, a second winding block on other endmost side in the axial direction of the winding core part, and a third winding block positioned between the first and second winding blocks. The second winding block is a winding block at an odd-numbered position counted from the first winding block. The first and second wires cross each other in an area between the first and third winding blocks and in an area between the second and third winding blocks.

14 Claims, 9 Drawing Sheets

COMMON MODE FILTER

BACKGROUND OF THE INVENTION

Field of the Invention

The present invention relates to a common mode filter and, more particularly, to a common mode filter of a type in which a pair of wires cross each other on the way and a manufacturing method therefor.

Description of Related Art

A common mode filter is widely used in many electronic devices, such as mobile electronic devices and on-vehicle LANs, as an element for removing common mode noise superimposed on differential signal lines. In recent years, a common mode filter using a surface-mountable drum core supersedes a common mode filter using a toroidal core (see JP 2014-199904 A).

In the common mode filter described in JP 2014-199904 A, a pair of wires are made to cross each other on the way to thereby enhance symmetry between differential signals in a high-frequency region.

However, when the pair of wires are made to cross each other on the way, the positional relationship between the wires is inverted, so that it is necessary to cross the wires once again in order to restore the positional relationship to its original state. Then, when the second crossing is made near the wire end portion, a difference occurs, in which the wires cross each other at one end portion while they do not cross each other at the other end portion, which may cause deterioration of high-frequency characteristics such as reflection characteristics (return loss) or noise conversion characteristics.

SUMMARY

It is therefore an object of the present invention to improve high-frequency characteristics in the common mode filter in which the pair of wires are made to cross each other.

A common mode filter according to the present invention includes a winding core part and first and second wires wound in the same direction around the winding core part. The first and second wires constitute a first winding block wound a plurality of turns on one endmost side in the axial direction of the winding core part and a second winding block wound a plurality of turns on the other endmost side in the axial direction of the winding core part, and a third winding block positioned between the first and second winding blocks and including an odd number of blocks each wound a plurality of turns. The second winding block is a winding block at an odd-numbered position counted from the first winding block. The first and second wires cross each other in an area between the first and third winding blocks and in an area between the second and third winding blocks.

According to the present invention, the number of the winding blocks is an odd number, so that when the first and second wires are made to cross each other even number of times in the areas between the winding blocks axially adjacent to each other, the positional relationship between the first and second wires at one end portion and that at the other end portion can be made to coincide with each other. As a result, conditions of one and the other end portions of the first and second wires coincide with each other, making it possible to enhance high-frequency characteristics such as reflection characteristics (return loss) or noise conversion characteristics.

In the present invention, the number of turns in the first winding block and that in the second winding block may be equal to each other. This enhances symmetry between the first and second winding blocks positioned on both sides, making it possible to eliminate product directionality.

In the present invention, the total number of turns in the first and second winding blocks and the number of turns in the third winding block may be equal to each other. Thus, when focusing on the same turns of the first and second wires, the number of pairs of the first and second wires in which the first wire is positioned on the one end side and the number of pairs of the first and second wires in which the second wire is positioned on the one end side coincide with each other. This enhances symmetry between signals flowing in the first and second wires, with the result that excellent high-frequency characteristics can be obtained.

In the present invention, the first, second, and third winding blocks may each have a first winding layer positioned in the lower layer and a second winding layer positioned on the upper layer of the first winding layer. This enhances wire winding density, making it possible to reduce the size of the winding core part in the axial direction.

In the present invention, the first and second wires may be positioned in the first winding layer and second winding layer, respectively, in any of the first, second, and third winding blocks. This allows the common mode filter to be produced by sequentially winding the first and second wires in this order. Alternatively, a configuration may be possible, in which the first and second wires are positioned in the first winding layer and second winding layer, respectively in the first and second winding blocks, and the first and second wires are positioned in the second winding layer and first winding layer, respectively in the third winding block. This can reduce a difference in length between the first and second wires.

In the present invention, the third winding block may include fourth, fifth, and sixth winding blocks arranged in this order as viewed from the first winding block. The first and second wires may cross each other in an area between the first and fourth winding blocks, in an area between the fourth and fifth winding blocks, in an area between the fifth and sixth winding blocks, and in an area between the sixth and second winding blocks. Thus, the first and second wires can be made to cross each other four times.

In the present invention, the number of turns in the first winding blocks and that in the fifth winding block may be equal to each other. This can enhance symmetry between the first and fifth winding blocks being at odd-numbered positions.

In the present invention, the number of turns in the fourth winding blocks and that in the sixth winding block may be equal to each other. This can enhance symmetry between the first and fifth winding blocks being at even-numbered positions.

In the present invention, the total number of turns in the first, second, and fifth winding blocks may be equal to that in the fourth and sixth winding blocks. This enhances symmetry between signals flowing in the first and second wires, making it possible to obtain excellent high-frequency characteristics.

In the present invention, the number of turns of each of odd-numbered winding blocks counting from the first winding block may be smaller than the number of turns of each of even-numbered winding blocks. This can reduce a difference between the total number of turns of the odd-numbered winding blocks and the total number of turns of the even-numbered winding blocks.

As described above, according to the present invention, it is possible to enhance the reflection characteristics of the common mode filter in which the pair of wires are made to cross each other on the way.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
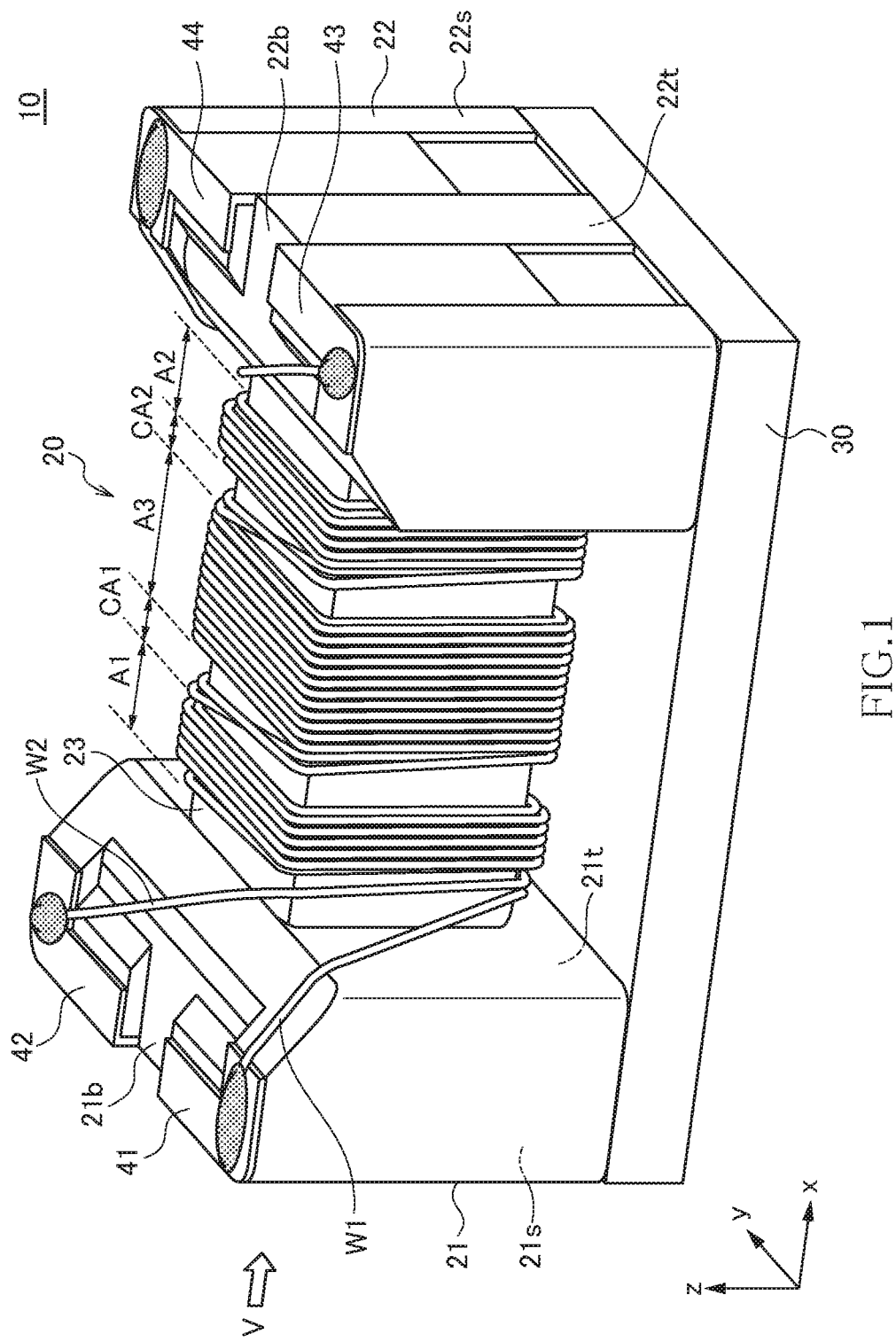
FIG. 1 is a schematic perspective view illustrating the outer appearance of a common mode filter according to a preferred embodiment of the present invention.

FIG. 1 is a schematic perspective view illustrating the outer appearance of a common mode filter 10 according to a preferred embodiment of the present invention.

As illustrated in FIG. 1, the common mode filter 10 according to the present embodiment includes a drum core 20, a plate core 30, first to fourth terminal electrodes 41 to 44, and first and second wires W1 and W2. The drum core 20 and plate core 30 are each made of a magnetic material having comparatively high permeability, such as an Ni—Zn based ferrite. The first to fourth terminal electrodes 41 to 44 are each a metal fitting made of a good conductor material such as copper. The first to fourth terminal electrodes 41 to 44 may be obtained by directly baking silver paste or the like onto the drum core 20.

The drum core 20 has a first flange part 21, a second flange part 22, and a winding core part 23 disposed between the first and second flange parts 21 and 22. The winding core part 23 has its axial direction in the x-direction. The first and second flange parts 21 and 22 are disposed at both ends of the winding core part 23 in the axial direction and integrally formed with the winding core part 23. The plate core 30 is bonded to upper surfaces 21$t$ and 22$t$ of the respective flange parts 21 and 22. The upper surfaces 21$t$ and 22$t$ of the respective flange parts 21 and 22 constitute the xy plane, and their opposite surfaces are used as mounting surfaces 21$b$ and 22$b$. The first and second terminal electrodes 41 and 42 are each provided on the mounting surface 21$b$ and an outer surface 21$s$ of the first flange part 21, and the third and fourth terminal electrodes 43 and 44 are each provided on the mounting surface 22$b$ and an outer surface 22$s$ of the second flange part 22. The outer surfaces 21$s$ and 22$s$ each constitute the yz plane. The first to fourth terminals 41 to 44 are fixed by using an adhesive or the like.

The first and second wires W1 and W2 are wound around the winding core part 23 in the same direction. One and the other ends of the first wire W1 are connected respectively to the first and third terminal electrodes 41 and 43, and one and the other ends of the second wire W2 are connected respectively to the second and fourth terminal electrodes 42 and 44. The numbers of turns of the first and second wires W1 and W2 are the same.

As illustrated in FIG. 1, the winding core part 23 of the drum core 20 includes a first winding area A1 closest to the first flange part 21, a second winding area A2 closest to the second flange part 22, and a third winding area A3 positioned between the first and second winding areas A1 and A2. The area between the first and third winding areas A1 and A3 constitutes a first crossing area CA1, and the area between the second and third winding areas A2 and A3 constitutes a second crossing area CA2. The first and second wires W1 and W2 are aligned and wound in the first to third winding areas A1 to A3 and cross each other in the first and second crossing areas CA1 and CA2. When the first and second wires W1 and W2 cross each other, the positional relationship between the first and second wires W1 and W2 is changed before and after the crossing point.

Figure 2:
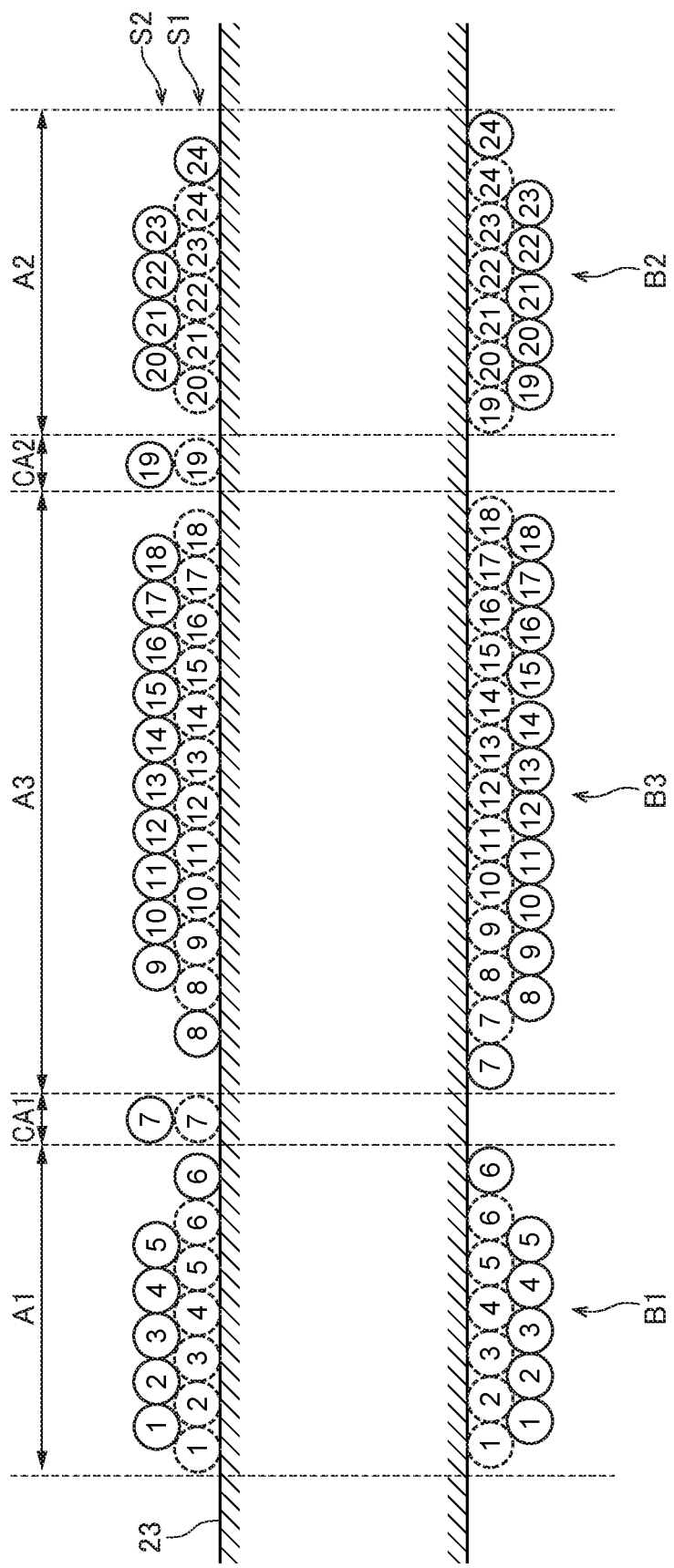
FIG. 2 is a schematic view for more specifically explaining the winding layout of the first and second wires.

FIG. 2 is a schematic view for explaining more in detail the winding layout of the first and second wires W1 and W2.

As illustrated in FIG. 2, the first and second wires W1 and W2 constitute a first winding block B1 wound around the first winding area A1, a second winding block B2 wound around the second winding area A2, and a third winding block B3 wound around the third winding area A3. As described above, the first and second wires W1 and W2 cross each other in the first and second crossing areas CA1 and CA2. In the example of FIG. 2, the number of turns in the first winding block B1 and that in the second winding block B2 are each six, and the number of turns in the third winding block B3 is 12. As a result, the first and second wires W1 and W2 each have a 24-turn configuration including 1st to 24th turns, but not limited thereto.

The first to third winding blocks B1 to B3 each have a double layer structure including a first winding layer S1 positioned in the lower layer and directly wound around the winding core part 23 and a second winding layer S2 positioned on the upper layer of the first winding layer S1 and wound around the winding core part 23 through the first winding layer S1. The first wire W1 is positioned in the first winding layer S1, and most part of the second wire W2 is positioned in the second winding layer S2. However, the 6th, 8th, and 24th turns of the second wire W2 are positioned in the first winding layer S1. This is because, in order to make the wires constituting the double layer structure stable, it is necessary to wound the upper layer wire along the valley line of the adjacent wires positioned in the lower layer, so that the number of turns of the wire positioned in the upper layer is smaller by one than the number of turns of the wire positioned in the lower layer, and the 6th, 8th, and 24th turns of the second wire W2 corresponds to this.

In the present embodiment, when the numbers of turns of the respective first and second wires W1 and W2 are counted with the first and second terminal electrodes 41 and 42 as a starting point, the 1st to 6th turns constitute the first winding block B1, the 7th to 18th turns constitute the third winding block B3, and the 19th to 24th turns constitute the second winding block B2. However, at each of the 7th and 19th turns at which the wires cross each other, the wires are partially positioned in the crossing area CA1 or CA2.

The 7th and 19th turns of the first and second wires W1 and W2 cross each other in the first and second crossing areas CA1 and CA2. When the first and second wires W1 and W2 cross each other, the positional relationship between the first and second wires W1 and W2 is inverted before and after the crossing point. Specifically, when focusing on the same turns of the first and second wires W1 and W2, in the first and second winding blocks B1 and B2, the first wire W1 is positioned on the left side (first flange part 21 side) in FIG. 2, and the second wire W2 is positioned on the right side (second flange part 22 side) in FIG. 2; whereas in the third winding block W3, the first wire W1 is positioned on the right side (second flange part 22 side), and the second wire W2 is positioned on the left side (first flange part 21 side).

In the present embodiment, the number of turns of each of the first and second wires W1 and W2 is six in both the first and second winding blocks B1 and B2 and is 12 in the third winding block B3. Accordingly, when focusing on the same turns of the first and second wires W1 and W2, the number of pairs of the first and second wires W1 and W2 in which the first wire W1 is positioned on the left side (second wire W2 is on the right side) is 12, and the number of pairs of the first and second wires W1 and W2 in which the first wire W1 is positioned on the right side (second wire W2 is on the left side) is also 12, thus enhancing symmetry between signals flowing in the first and second wires W1 and W2, with the result that excellent high-frequency characteristics can be obtained.

As illustrated in FIG. 1, in the present embodiment, the y-direction positions of the first and third terminal electrodes 41 and 43 connected with the first wire W1 are the same, and the y-direction positions of the second and fourth terminal electrodes 42 and 44 connected with the second wire W2 are the same. When viewed in the direction of the arrow V of FIG. 1, the first and third terminal electrodes 41 and 43 connected with the first wire W1 are positioned on the right side, and the second and fourth terminal electrodes 42 and 44 connected with the second wire W2 are positioned on the left side. Thus, when the first and second wires W1 and W2 are wound clockwise as viewed in the direction of the arrow V with the first and second terminal electrodes 41 and 42 as the starting point, the first wire W1 is positioned on the left side (first flange part 21 side) in FIG. 2, and the second wire W2 is positioned on the right side (second flange part 22 side) in FIG. 2 in the first winding block B1 when focusing on the same turns of the first and second wires W1 and W2 unless the wires are made to cross each other. The first and second wires W1 and W2 do not cross each other in the first winding block B1, so that the above positional relationship is maintained over the entire area of the first winding block B1.

When the first and second wires W1 and W2 are made to cross each other in the first crossing area CA1, the positional relationship between the first and second wires W1 and W2 is inverted. Thus, in the third winding block B3, the first wire W1 is positioned on the right side (second flange part 22 side) in FIG. 2, and the second wire W2 is positioned on the left side (first flange part 21 side) in FIG. 2 when focusing on the same turns of the first and second wires W1 and W2. In the third winding block B3, the first and second wires W1 and W2 do not cross each other, so that the above relationship is maintained over the entire third winding block B3.

When the first and second wires W1 and W2 are made to cross each other in the second crossing area CA2, the positional relationship between the first and second wires W1 and W2 is inverted once again. Thus, in the second winding block B2, the first wire W1 is positioned on the left side (first flange part 21 side) in FIG. 2, and the second wire W2 is positioned on the right side (second flange part 22 side) in FIG. 2 when focusing on the same turns of the first and second wires W1 and W2. In the second winding block B2, the first and second wires W1 and W2 do not cross each other, so that the above relationship is maintained over the entire second winding block B2.

Figure 3:
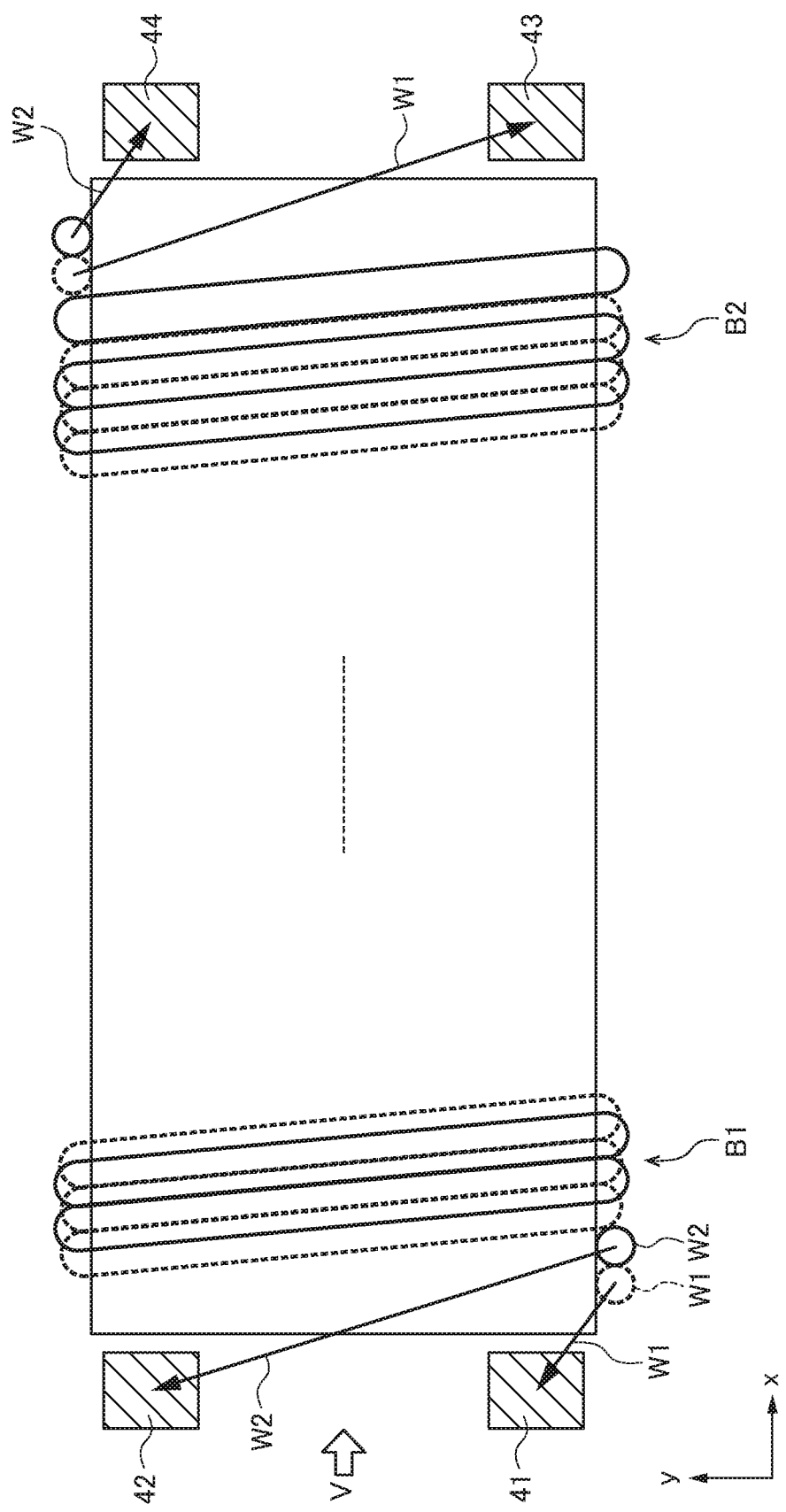
FIG. 3 is a schematic view for explaining a reason why the 24th turns of the respective first and second wires do not cross each other.

As described above, when viewed in the direction of the arrow V of FIG. 1, the third terminal electrode 43 is positioned on the right side, and the fourth terminal electrode 44 is positioned on the left side, so that, as illustrated in FIG. 3 which is a schematic view of the winding layout, it is possible to connect the terminal ends of the respective first and second wires W1 and W2 to the third and fourth terminal electrodes 43 and 44, respectively, without making the first and second wires W1 and W2 cross each other any more.

Thus, in the common mode filter 10 according to the present embodiment, the number of the winding blocks is set to three, and the number of crossing times between the wires is set to two, so that the positional relationship between the first and second wires W1 and W2 is the same between the first winding block B1 and second winding block B2. Therefore, conditions of one and the other end portions of the first and second wires W1 and W2 coincide with each other. This prevents occurrence of unbalance due to difference in the conditions of the wire end portions, making it possible to enhance high-frequency characteristics such as reflection characteristics (return loss) or noise conversion characteristics.

On the other hand, assuming that the number of the winding blocks is set to an even number (e.g., two), and the number of the wire crossing times is set to an odd number (e.g., one), the positional relationship between wires in the wiring area closest to the first flange part 21 and the positional relationship between the wires in the winding area closest to the second flange part 22 are inverse to each other. Thus, in order to connect the terminal ends of the respective first and second wires W1 and W2 to the third and fourth terminal electrodes 43 and 44, respectively, it is necessary to make the first and second wires W1 and W2 cross each other once again so as to restore the positional relationship to its original state.

Figure 4:
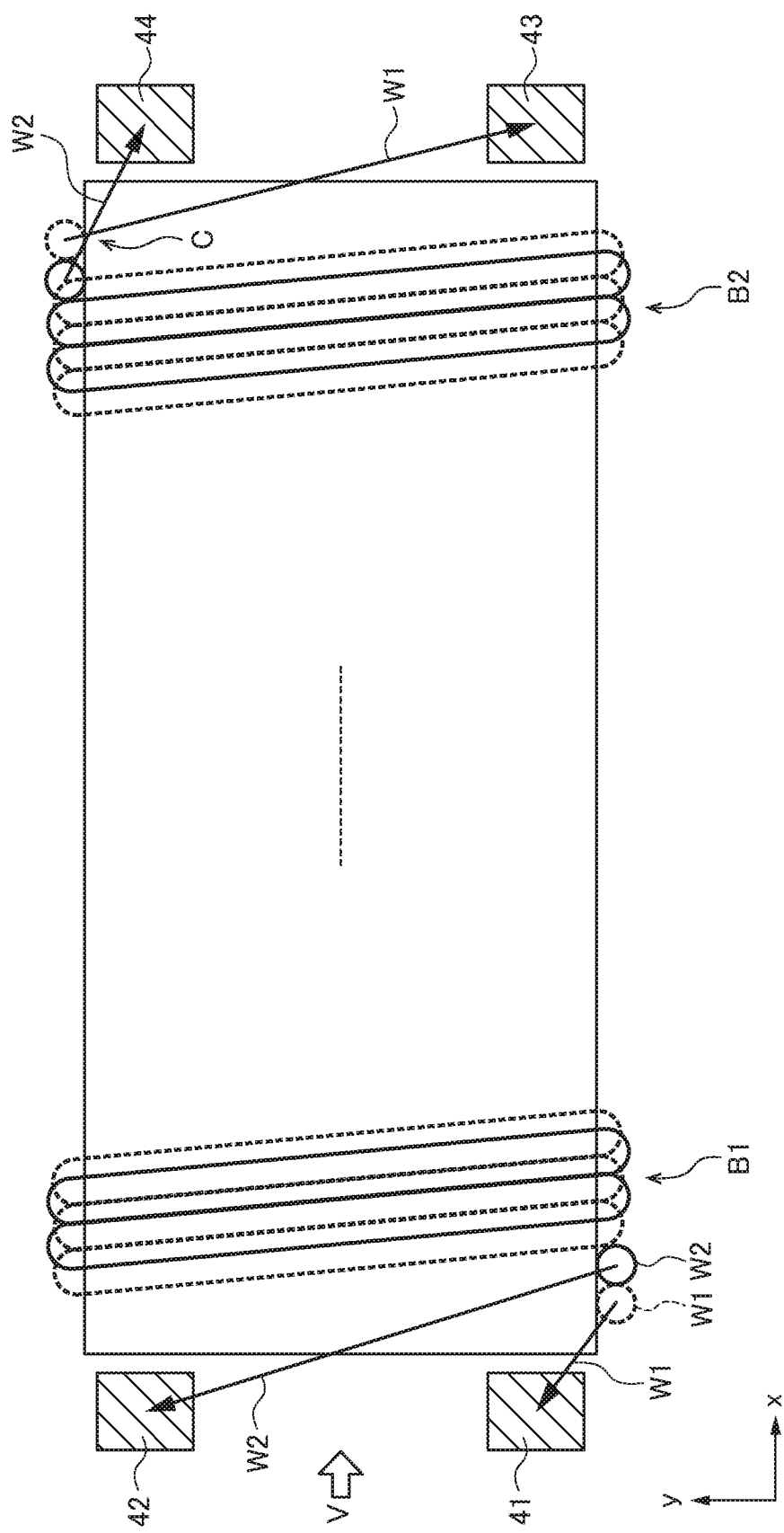
FIG. 4 is a schematic view for explaining a state where the last turns of the respective first and second wires cross each other in a common mode filter of a comparative example.

FIG. 4 is a schematic view for explaining a state where the last turns of the respective first and second wires W1 and W2 cross each other in a common mode filter of a comparative example.

As illustrated in FIG. 4, when viewed in the direction of the arrow V, the first terminal electrode 41 is positioned on the right side, and the second terminal electrode 42 is positioned on the left side, so that when the first and second wires W1 and W2 are wound clockwise without being made to cross each other, the first wire W1 is positioned on the first flange part 21 side, and the second wire W2 is positioned on the second flange part 22 side. This positional relationship is inverted every time the wires cross each other. However, when the number of the wire crossing times is an odd number, the inverted state is maintained in the winding block closest to the second flange part 22, with the result that the first wire W1 is positioned on the second flange part 22 side, and the second wire W2 is positioned on the first flange part side. When connecting the terminal ends of the respective first and second wires W1 and W2 respectively to the third and fourth terminal electrodes 43 and 44 in this state, the last turns of the respective first and second wires W1 and W2 cross each other as denoted by the arrow C since the third terminal electrode 43 is positioned on the right side, and the fourth terminal electrode 44 is positioned on the left side as viewed in the direction of the arrow V.

Figure 5:
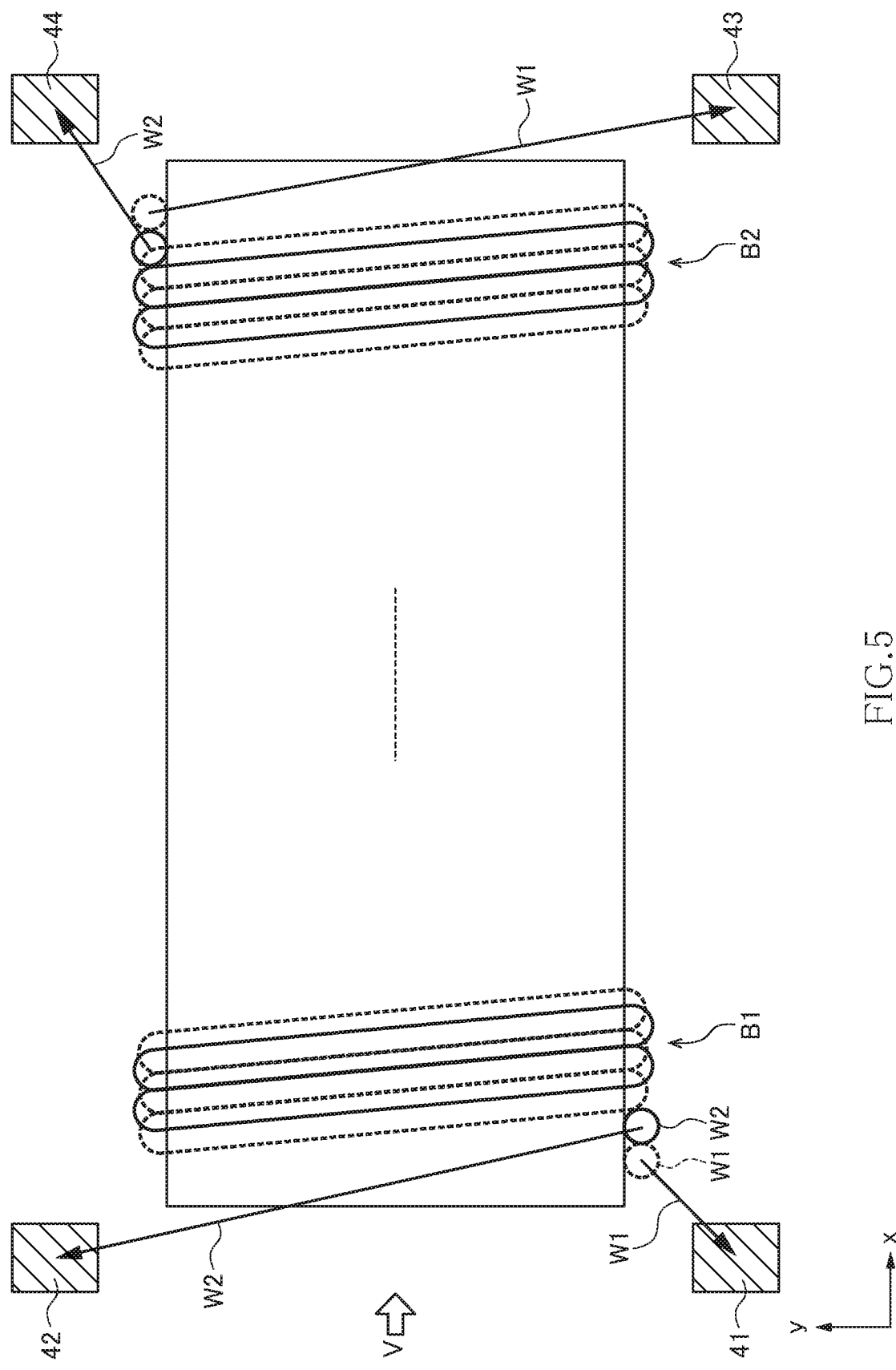
FIG. 5 is a schematic view for explaining another state where the last turns of the respective first and second wires cross each other in a common mode filter of a comparative example.
Figure 6:
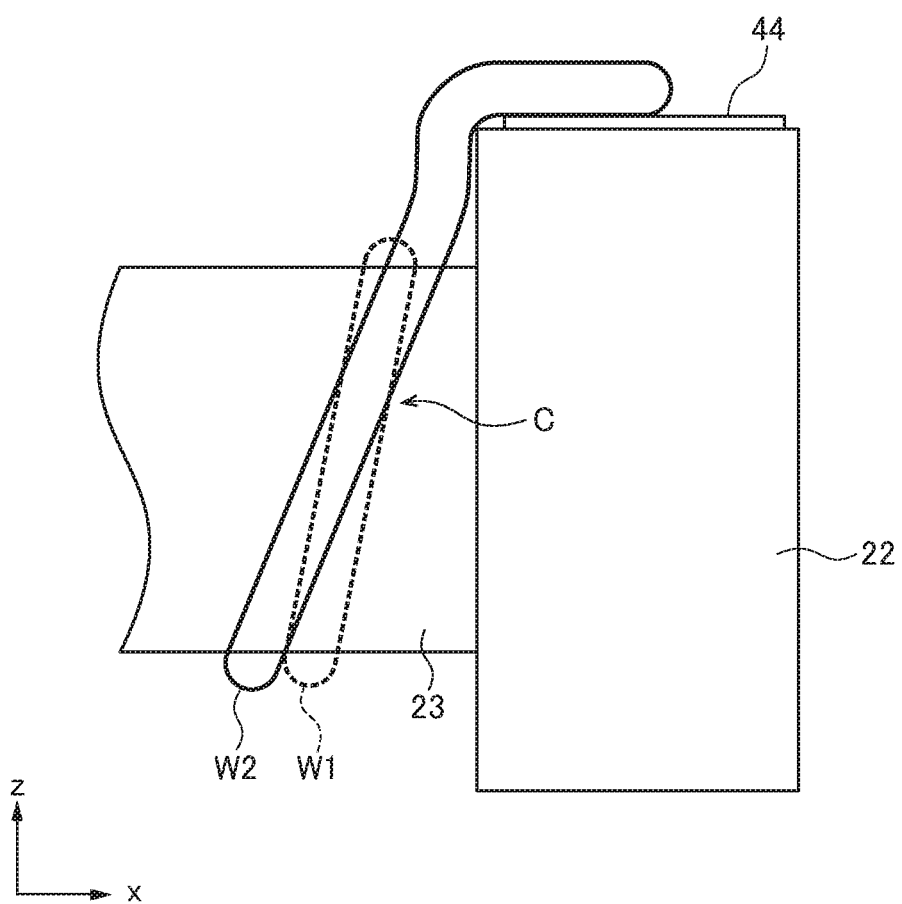
FIG. 6 is a schematic view for explaining still another state where the last turns of the respective first and second wires cross each other in a common mode filter of a comparative example.

When the distance between the third and fourth terminal electrodes 43 and 44 in the y-direction is large as illustrated in FIG. 5, the last turns of the respective first and second wires W1 and W2 do not cross each other apparently as viewed from above (as viewed in the z-direction). However, in this case, as illustrated in FIG. 6, the first and second wires W1 and W2 cross each other on the xz surface of the winding core part 23. That is, at any rate, when the last turns of the respective first and second wires W1 and W2 are made to cross each other, there occurs a necessity of restoring the positional relationship between the first and second wires W1 and W2 to its original state.

As described above, when the number of the wire crossing times in the areas between the winding blocks is an odd number, the 1st turns of the respective first and second wires W1 and W2 positioned on one end side do not cross each other, but the last turns positioned on the other end side cross each other. Thus, in the first and second wires W1 and W2, there occurs a difference between a capacitance component generated at the one end side and that generated at the other end side, and this unbalance can cause deterioration in high-frequency characteristics such as reflection characteristics. However, in the common mode filter 10 according to the present invention, the number of the winding blocks is set to three (odd number), and the number of the wire crossing times is set to two (even number) in the areas between the winding blocks, so that the unbalance does not occur. As a result, high-frequency characteristics such as reflection characteristic can be enhanced.

As described above, in the common mode filter 10 according to the present embodiment, the number of the winding block is set to three (odd number), and the number of the wire crossing times is set to two (even number), so that conditions of one and the other end portions of the first and second wires W1 and W2 coincide with each other. This prevents occurrence of unbalance due to difference in the conditions of the wire end portions, making it possible to enhance high-frequency characteristics such as reflection characteristics (return loss) or noise conversion characteristics.

In addition, in the present embodiment, the number of turns in the first winding block B1 and the number of turns in the second winding block B2 are equal to each other, so that symmetry between the first and second winding blocks B1 and B2 positioned on both sides can be enhanced. This can eliminate product directionality. Further, in the present embodiment, the total number of turns in the first and second winding blocks B1 and B2 and the number of turns in the third winding block B3 are equal to each other, so that the number of pairs of the first and second wires W1 and W2 in which the first wire W1 is positioned on the left side (first flange 21 side) and the second wire W2 is positioned on the right side (second flange 22 side) and the number of pairs of the first and second wires W1 and W2 in which the first wire W1 is positioned on the right side (second flange 22 side) and the second wire W2 is positioned on the left side (first flange 21 side) coincide with each other. This enhances symmetry between signals flowing in the first and second wires W1 and W2, with the result that excellent high-frequency characteristics can be obtained.

Further, in the present embodiment, the second wire W2 is wound over the first wire W1, so that wire winding density is enhanced. This can reduce the size of the winding core part 23 in the axial direction (x-direction).

Hereinafter, some modifications of the common mode filter 10 will be described. The structures of the modifications described below are also included in the scope of the present invention.

Figure 7:
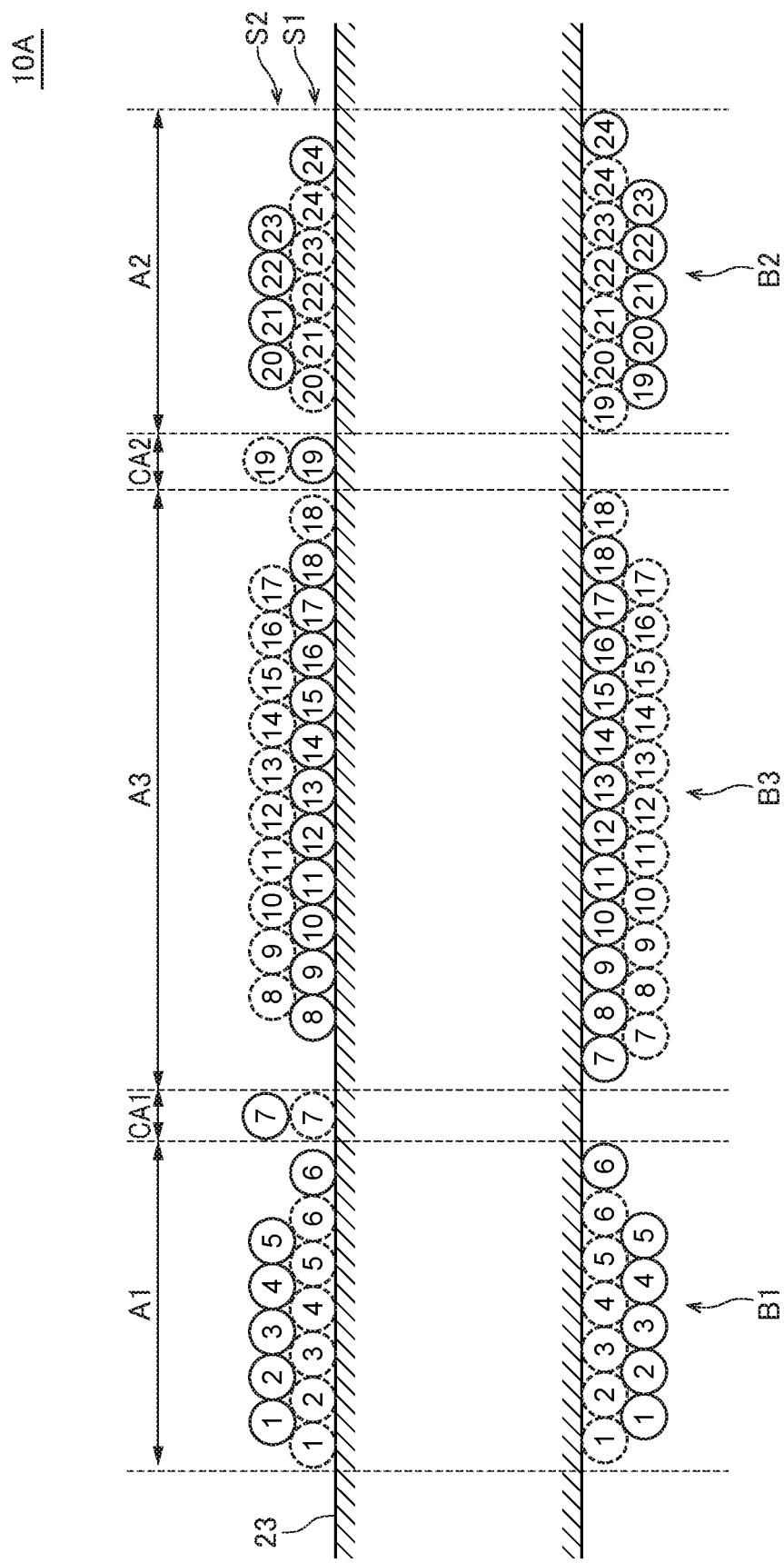
FIG. 7 is a schematic view for explaining the winding layout of a common mode filter according to a first modification.

FIG. 7 is a schematic view for explaining the winding layout of a common mode filter 10A according to a first modification.

The common mode filter 10A illustrated in FIG. 7 differs from the common mode filter 10 according to the above embodiment in that, in the third winding block B3, the second wire W2 is positioned in the first winding layer S1 (lower layer), and the first wire W1 is positioned in the second winding layer S2 (upper layer). As exemplified in the first modification, the vertical positional relationship between the first and second wires W1 and W2 in the first and second winding blocks B1 and B2 and that in the third winding block B3 may be inverted. This brings about an advantage that the lengths of the first and second wires W1 and W2 are substantially equal to each other.

Figure 8:
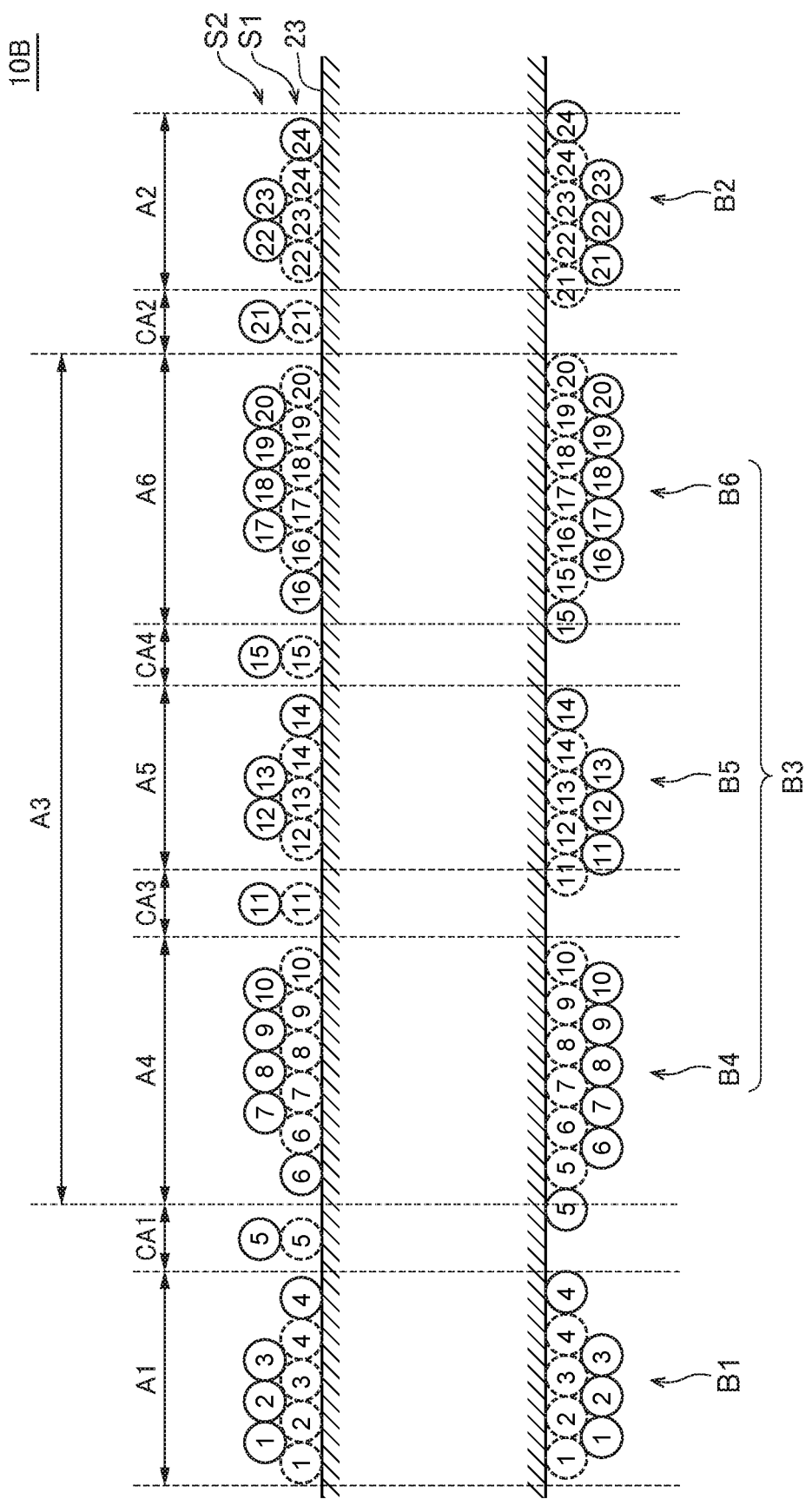
FIG. 8 is a schematic view for explaining the winding layout of a common mode filter according to a second modification.

FIG. 8 is a schematic view for explaining the winding layout of a common mode filter 10B according to a second modification.

In the common mode filter 10B according to the second modification, the third winding area A3 of the winding core part 23 is divided into fourth to sixth winding areas A4 to A6 and third and fourth crossing areas CA3 and CA4. The fourth to sixth winding area A4 to A6 are arranged in this order as viewed from the first winding area A1 to constitute fourth to sixth winding blocks B4 to B6, respectively.

The numbers of turns in the first, second, and fifth winding blocks B1, B2, and B5 are each four, and the numbers of turns in the fourth and sixth winding blocks B4 and B6 are each six. The first and second wires W1 and W2 cross each other in the first to fourth crossing areas CA1 to CA4. Thus, when focusing on the same turns of the first and second wires W1 and W2, the first wire W1 is positioned on the left side (first flange part 21 side) in FIG. 8, and the second wire W2 is positioned on the right side (second flange part 22 side) in FIG. 8 in the first, second, and fifth winding blocks B1, B2, and B5 at odd-numbered positions; whereas the first wire W1 is positioned on the right side (second flange part 22 side), and the second wire W2 is positioned on the left side (first flange part 21 side) in the fourth and sixth winding blocks B4 and B6 at even-numbered positions.

The number of turns of each of the first and second wires W1 and W2 is four in the first, second, and fifth winding blocks B1, B2, and B5 at odd-numbered positions and is six in the fourth and sixth winding blocks B4 and B6 at even-numbered positions, so that when focusing on the same turns of the first and second wires W1 and W2, the number of pairs of the first and second wires W1 and W2 in which the first wire W1 is positioned on the left side (second wire W2 is on the right side) is 12, and the number of pairs of the first and second wires W1 and W2 in which the first wire W1 is positioned on the right side (second wire W2 is on the left side) is also 12.

As exemplified in the second modification, the number of the winding blocks need not necessarily be three, but may be five. That is, when an odd number of the winding blocks are constituted, and the first and second wires W1 and W2 are made to cross each other in the areas between winding blocks axially adjacent to each other, the number of crossing times becomes an odd number, so that conditions of one and the other end portions of the first and second wires W1 and W2 can be made to coincide with each other.

Figure 9:
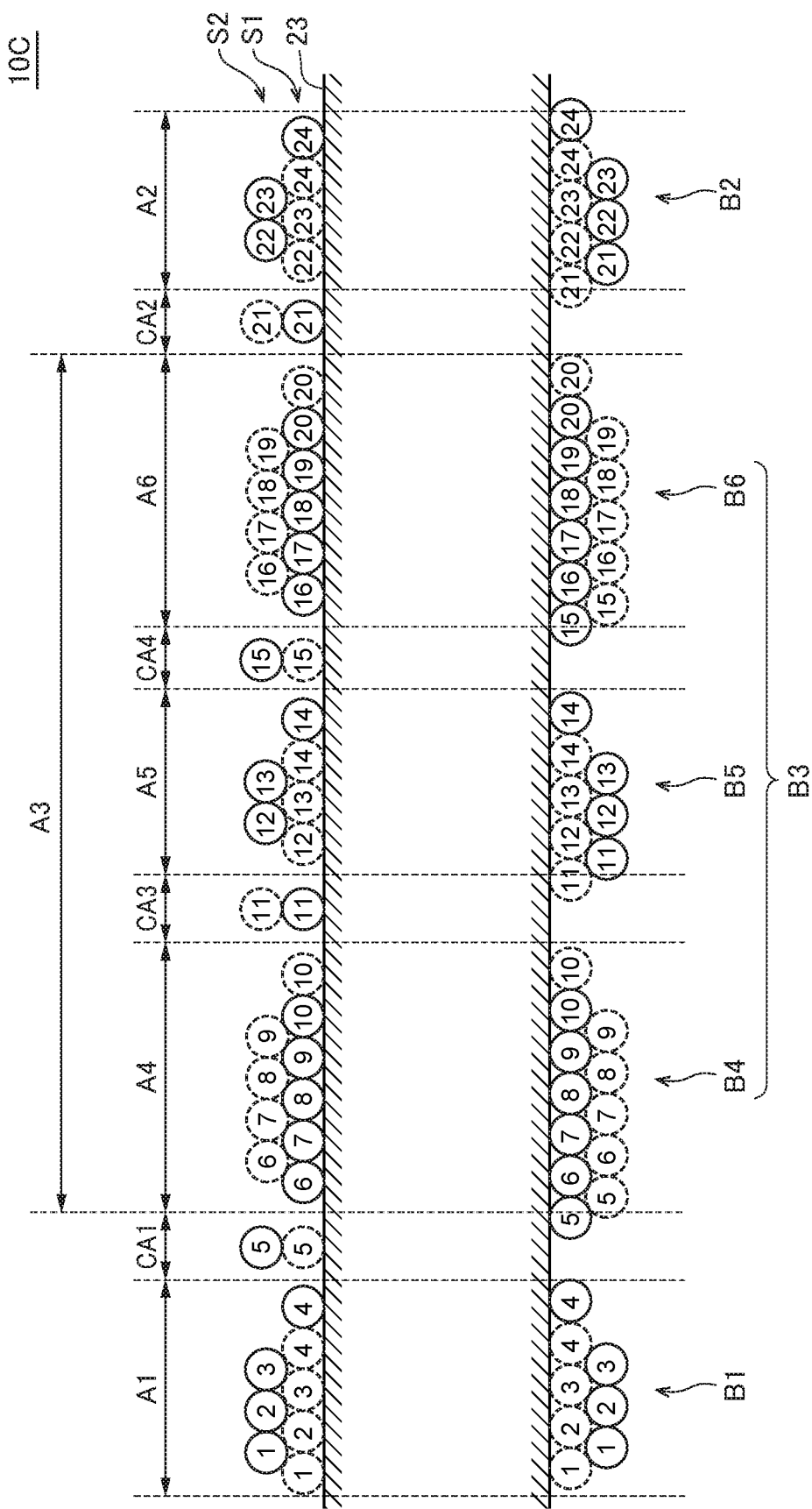
FIG. 9 is a schematic view for explaining the winding layout of a common mode filter according to a third modification.

FIG. 9 is a schematic view for explaining the winding layout of a common mode filter 10C according to a third modification.

The common mode filter 10C illustrated in FIG. 9 differs from the common mode filter 10B according to the second modification in that, in the fourth and sixth winding blocks B4 and B6, the second wire W2 is positioned in the first winding layer S1 (lower layer), and the first wire W1 is positioned in the second winding layer S2 (upper layer). This brings about an advantage that the lengths of the first and second wires W1 and W2 are substantially equal to each other, as in the first modification.

It is apparent that the present invention is not limited to the above embodiments, but may be modified and changed without departing from the scope and spirit of the invention.

For example, in the above embodiment, the first and second wires W1 and W2 are each wound in a direction from the 1st turn to the 24th turn at the time of manufacture; however, conversely, they may be wound in a direction from the 24th turn to the 1st turn.

Further, although all the winding blocks have the double layer structure in the above embodiment, the first and second wires W1 and W2 may be wound in a bifilar manner in some or all of the winding blocks.

What is claimed is:

1. A common mode filter comprising:
    a winding core part; and
    first and second wires wound in a same direction around the winding core part,
    wherein the first and second wires constitute a first winding block wound a plurality of turns on one endmost side in an axial direction of the winding core part, a second winding block wound a plurality of turns on another endmost side in the axial direction of the winding core part, and a third winding block positioned between the first and second winding blocks, the third winding block including an odd number of blocks each wound a plurality of turns,
    wherein the second winding block is a winding block at an odd-numbered position counted from the first winding block,
    wherein the first and second wires cross each other in an area between the first and third winding blocks and in an area between the second and third winding blocks,
    wherein each of the first, second, and third winding blocks has a first winding layer positioned in a lower layer and a second winding layer positioned on an upper layer of the first winding layer,
    wherein the first and second wires are positioned in the first winding layer and second winding layer, respectively in the first and second winding blocks, and
    wherein the first and second wires are positioned in the second winding layer and first winding layer, respectively in the third winding block.

2. The common mode filter as claimed in claim 1, wherein a number of turns in the first winding block and that in the second winding block are equal to each other.

3. The common mode filter as claimed in claim 1, wherein a total number of turns in the first and second winding blocks and a number of turns in the third winding block are equal to each other.

4. The common mode filter as claimed in claim 1, wherein a number of turns of each of odd-numbered winding blocks counting from the first winding block is smaller than a number of turns of each of even-numbered winding blocks.

5. The common mode filter as claimed in claim 1, wherein the first and second wires are positioned in the first winding layer and second winding layer, respectively, in any of the first, second, and third winding blocks.

6. The common mode filter as claimed in claim 1,
    wherein the third winding block includes fourth, fifth, and sixth winding blocks arranged in this order as viewed from the first winding block, and
    wherein the first and second wires cross each other in an area between the first and fourth winding blocks, in an area between the fourth and fifth winding blocks, in an area between the fifth and sixth winding blocks, and in an area between the sixth and second winding blocks.

7. The common mode filter as claimed in claim 6, wherein a total number of turns in the first, second, and fifth winding blocks is equal to that in the fourth and sixth winding blocks.

8. The common mode filter as claimed in claim 6, wherein a number of turns in the first winding blocks and that in the fifth winding block are equal to each other.

9. The common mode filter as claimed in claim 6, wherein a number of turns in the fourth winding blocks and that in the sixth winding block are equal to each other.

10. A common mode filter comprising:
    a winding core part including first, second, third, fourth and fifth sections arranged in an axial direction in this order; and
    first and second wires wound around the winding core part,
    wherein the first and second wires are wound a plurality of turns in each of the first, third, and fifth sections,
    wherein the first and second wires cross each other in each of the second and fourth sections, and
    wherein a number of turns in the third section is larger than each of numbers of turns in the first and fifth sections.

11. The common mode filter as claimed in claim 10, wherein the number of turns in the first section and the number of turns in the third section are equal to each other.

12. The common mode filter as claimed in claim 10, further comprising:
    a first flange part provided at one end of the winding core part in the axial direction; and
    a second flange part provided at another end of the winding core part in the axial direction,
    wherein the first and second wires do not cross each other between the first flange part and the first section of the winding core part, and
    wherein the first and second wires do not cross each other between the second flange part and the fifth section of the winding core part.

13. A common mode filter comprising:
    a winding core part; and
    first and second wires wound in a same direction around the winding core part,
    wherein the first and second wires constitute a first winding block wound a plurality of turns on one endmost side in an axial direction of the winding core part, a second winding block wound a plurality of turns on another endmost side in the axial direction of the winding core part, and a third winding block positioned between the first and second winding blocks, the third winding block including an odd number of blocks each wound a plurality of turns, wherein the second winding block is a winding block at an odd-numbered position counted from the first winding block, wherein the first and second wires cross each other in an area between the first and third winding blocks and in an area between the second and third winding blocks, wherein the third winding block includes fourth, fifth, and sixth winding blocks arranged in this order as viewed from the first winding block, and wherein the first and second wires cross each other in an area between the first and fourth winding blocks, in an area between the fourth and fifth winding blocks, in an area between the fifth and sixth winding blocks, and in an area between the sixth and second winding blocks.

14. A common mode filter comprising:
a winding core part; and
first and second wires wound in a same direction around the winding core part, wherein the first and second wires constitute a first winding block wound a plurality of turns on one endmost side in an axial direction of the winding core part, a second winding block wound a plurality of turns on another endmost side in the axial direction of the winding core part, and a third winding block positioned between the first and second winding blocks, the third winding block including an odd number of blocks each wound a plurality of turns, wherein the second winding block is a winding block at an odd-numbered position counted from the first winding block, wherein the first and second wires cross each other in an area between the first and third winding blocks and in an area between the second and third winding blocks, and wherein a number of turns of each of odd-numbered winding blocks counting from the first winding block is smaller than a number of turns of each of even-numbered winding blocks.

* * * * *